United States Patent
Rao

(10) Patent No.: US 8,050,080 B2
(45) Date of Patent: Nov. 1, 2011

(54) RANDOM ACCESS MEMORY WITH CMOS-COMPATIBLE NONVOLATILE STORAGE ELEMENT IN SERIES WITH STORAGE CAPACITOR

(75) Inventor: G. R. Mohan Rao, McKinney, TX (US)

(73) Assignee: S. Aqua Semiconductor LLC, Wilmington, DE (US)

( * ) Notice: Subject to any disclaimer, the term of this patent is extended or adjusted under 35 U.S.C. 154(b) by 115 days.

(21) Appl. No.: 12/043,044

(22) Filed: Mar. 5, 2008

(65) Prior Publication Data
US 2009/0225584 A1   Sep. 10, 2009

(51) Int. Cl.
G11C 11/24 (2006.01)
G11C 7/00 (2006.01)
(52) U.S. Cl. ........................................ 365/149; 365/203
(58) Field of Classification Search . 365/185.01–185.33
See application file for complete search history.

(56) References Cited

U.S. PATENT DOCUMENTS

| | | | |
|---|---|---|---|
| 4,233,672 A | 11/1980 | Suzuki et al. | |
| 4,449,205 A | 5/1984 | Hoffman | |
| 5,043,946 A | 8/1991 | Yamauchi et al. | |
| 5,757,696 A | 5/1998 | Matsuo et al. | |
| 5,835,932 A | 11/1998 | Rao | |
| 5,890,195 A | 3/1999 | Rao | |
| 5,995,409 A | 11/1999 | Holland | |
| 6,222,216 B1 | 4/2001 | Rao | |
| 6,282,118 B1 | 8/2001 | Lung et al. | |
| 6,654,284 B2 | 11/2003 | Hsu et al. | |
| 6,963,122 B1 * | 11/2005 | Soenen et al. | 257/532 |
| 6,992,928 B2 | 1/2006 | Inoue | |
| 7,885,110 B2 | 2/2011 | Rao | |
| 2005/0041470 A1 * | 2/2005 | Inoue | 365/185.08 |
| 2006/0120138 A1 | 6/2006 | Liaw et al. | |
| 2007/0016720 A1 * | 1/2007 | Cohen | 711/103 |
| 2007/0076510 A1 | 4/2007 | Mangan et al. | |

(Continued)

FOREIGN PATENT DOCUMENTS

EP   1437742   7/2004

(Continued)

OTHER PUBLICATIONS

Hayashikoshi et al. ("A Dual Mode Sensing Scheme of Capacitor-Coupled EEPROM Cell", included in applicants IDS dated Mar. 10, 2010).*

(Continued)

Primary Examiner — Hoai Ho
Assistant Examiner — James G Norman
(74) Attorney, Agent, or Firm — Schwabe, Williamson & Wyatt, P.C.

(57) ABSTRACT

Random access memory with CMOS-compatible nonvolatile storage element in series with storage capacitor is described herein. Embodiments may include memory devices and systems that have plurality of row lines, column lines, and memory cells each of which comprising an access transistor, a storage capacitor and a CMOS-compatible non-volatile storage element connected in series. The CMOS-compatible non-volatile storage element may store charges corresponding to a binary value. The node located between the CMOS-compatible non-volatile storage element and the storage capacitor may be defined as a storage node. During read operation, a cell may be selected, and the voltage at the storage node of the cell may be sensed at the corresponding column line, and the binary value may be determined based on at least the sensed voltage.

26 Claims, 4 Drawing Sheets

U.S. PATENT DOCUMENTS

2007/0296486 A1* 12/2007 Ambroggi et al. ............ 327/536
2009/0237997 A1   9/2009 Rao
2009/0244970 A1 10/2009 Rao

FOREIGN PATENT DOCUMENTS

WO     2009111270     9/2009
WO     2009120691   10/2009
WO     2009154833   12/2009

OTHER PUBLICATIONS

International Search Report and Written Opinion mailed Apr. 22, 2009 for PCT/US2009/035329.
Hayashikoshi, M. et al., "A Dual-Mode Sensing Scheme of Capacitor-Coupled EEPROM Cell," IEEE Journal of Solid-State Circuits, Apr. 1992, pp. 569-573.
International Search Report and Written Opinion, issued in International Patent Application No. PCT/US2009/038096, mailed Jul. 2, 2009, 15 pages.
International Search Report and Written Opinion, issued in International Patent Application No. PCT/US2009/038290, mailed Dec. 21, 2009, 12 pages.
Office Action, issued in U.S. Appl. No. 12/053,976, mailed Dec. 11, 2009.
Office Action, issued in U.S. Appl. No. 12/053,976, mailed May 27, 2010.
Office Action, issued in U.S. Appl. No. 12/054,973, mailed Apr. 15, 2010.
Office Action, issued in U.S. Appl. No. 12/054,973, mailed Jun. 18, 2010.
International Preliminary Report on Patentability, issued in International Patent Application No. PCT/US2009/035329, mailed Sep. 16, 2010, 9 pages.
International Preliminary Report on Patentability, issued in International Patent Application No. PCT/US2009/038096, mailed Oct. 7, 2010, 11 pages.
International Preliminary Report on Patentability, issued in International Patent Application No. PCT/US2009/038290, mailed Oct. 7, 2010, 8 pages.
Office Action, issued in U.S. Appl. No. 12/054,973, mailed Jun. 18, 2010, 11 pages.
Office Action, issued in U.S. Appl. No. 12/053,976, mailed Sep. 1, 2010, 8 pages.
Notice of Allowance, issued in U.S. Appl. No. 12/054,973, mailed Sep. 29, 2010, 9 pages.
Final Office Action, issued in U.S. Appl. No. 12/053,976, mailed Feb. 11, 2011, 7 pages.
Notice of Allowance, issued in U.S. Appl. No. 12/053,976, mailed Apr. 14, 2011, 9 pages.
Supplmental Ntc of Allowability, issued in U.S. Appl. No. 12/053,976, mailed Apr. 18, 2011, 6 pages.

* cited by examiner

RANDOM ACCESS MEMORY WITH CMOS-COMPATIBLE NONVOLATILE STORAGE ELEMENT IN SERIES WITH STORAGE CAPACITOR

TECHNICAL FIELD

Embodiments of the disclosure relate to the field of electronic circuits. In particular to digital memories having CMOS-Compatible Nonvolatile Storage Element in series with storage capacitor.

BACKGROUND

Standard DRAM utilizes a capacitor to store a charge. Advantages include fast read and true random access, but the device is volatile and requires refresh to maintain the stored charge. U.S. Pat. Nos. 5,995,409 and 6,222,216 describe DRAM with some contiguous memory space dedicated to nonvolatile storage. This is accomplished by "shorting" capacitors to either "1" or "0" to provide nonvolatile—but not reprogrammable—digital memory.

Flash memory, both NOR and NAND types, provides one type of reprogrammable non-volatile memory. Flash memory read times are relative slow due to limitations of the floating-gate transistor—or split-channel floating-gate transistor—that forms the basis for the flash memory cell. In standard flash, in order to properly engineer the floating-gate transistor for write and erase, the transistor regions are heavily doped. This creates a high threshold voltage (approximately 1V) relative to the power supply voltage in current art (approximately 1.8V), across the drain and source. This relatively high threshold voltage is needed to avoid "unintended disturbances" in unselected nonvolatile memory cells. When 1.5V (approximately) is applied to the control gate to select the transistor, the amount of current from source to drain is accordingly relatively low, and it therefore takes a relatively long time for the circuit to drive the bit line connected to the floating-gate transistor. Thus, the time required to sense the current—which corresponds to the stored charge—is longer than sensing times in standard DRAM, for example. This challenge is further complicated and worsened for device and circuit optimization as nonvolatile memory systems demand multilevel storage (instead of 1 bit binary only).

Split-channel flash (developed in the 1980s) utilizes a split-channel floating-gate transistor to provide reprogrammable non-volatile memory, but these have numerous limitations such as requiring source-side programming and the slower read times of Flash memory.

BRIEF DESCRIPTION OF THE DRAWINGS

Embodiments will be readily understood by the following detailed description in conjunction with the accompanying drawings. Embodiments of the disclosure are illustrated by way of example and not by way of limitation in the figures of the accompanying drawings.

DETAILED DESCRIPTION OF EMBODIMENTS

Figure 1:
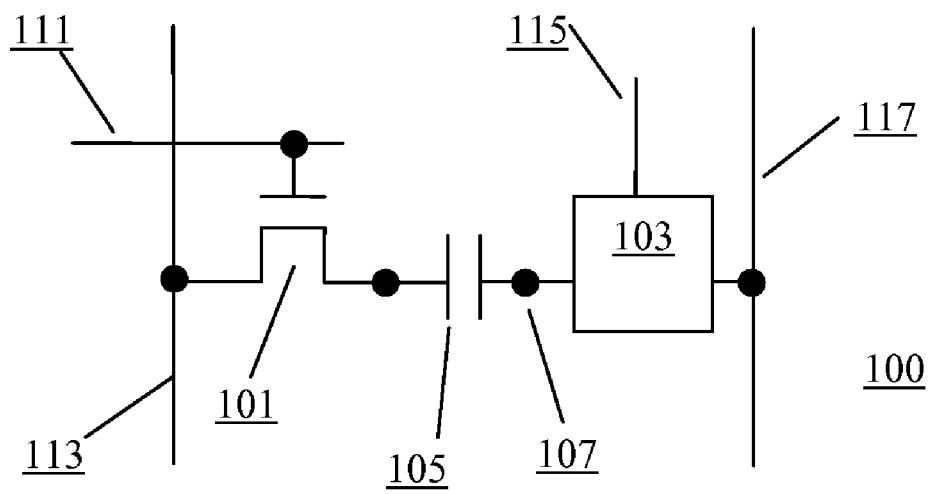
FIG. 1 illustrates a Random Access Memory cell with CMOS-Compatible Nonvolatile Storage Element in series with storage capacitors in accordance with various embodiments.

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments, are synonymous.

Embodiments may include memory devices and systems that have plurality of row lines, column lines, and memory cells each of which comprising an access transistor, a storage capacitor and a CMOS-compatible non-volatile storage element connected in series. Select voltage may be provided to the row lines to select one or more cells. Pre-charge voltage may be provided to the column lines for the purpose of sensing. The CMOS-compatible non-volatile storage element may store charges corresponding to multiple levels. In embodiments, two-level storage ("1" and "0") is known as binary. In other embodiments, the multi level storage can be represented as $2^n$, where n is an integer. The node located between the CMOS-compatible non-volatile storage element and the storage capacitor may be defined as a storage node. During read operation, a cell may be selected, and the voltage at the storage node of the cell may be sensed at the corresponding column line, and the binary value may be determined based on at least the sensed voltage. The voltage range can be sensed at the column line may at least be determined by the capacitance ratio of a voltage dependent capacitor of the column line and the storage capacitor.

FIG. 1 illustrates a memory cell 100 with CMOS-Compatible Nonvolatile Storage Element 103 and storage capacitor 105 in accordance with various embodiments. Storage capacitor 105 may be connected in series with CMOS-Compatible Nonvolatile Storage Element 103 holding a charge corresponding to a stored binary value. In embodiments, the stored binary value may be an n-bit binary value. Access transistor 101 may be connected in series with storage capacitor 105. In embodiments, a first plate of storage capacitor 105 and a first node of CMOS-Compatible Nonvolatile Storage Element 103 may both be connected to storage node 107. And, a second plate of storage capacitor 105 may be connected to a first node of access transistor 101. In embodiments, a second node of CMOS-Compatible Nonvolatile Storage Element 103 may be connected to drain line 117 and a third node of Element 103 may be connected to control line 115. In embodiments, a second node of access transistor 101 may be connected to column line 113. Access transistor 101 may have a word line gate connected to row line 111.

In embodiments, CMOS-compatible non-volatile storage element 103 may be a Magnetoresistive Random Access Memory (MRAM) cell, Phase-change memory (PCM) cell, or floating-gate transistor (e.g. a flash memory cell).

Figure 2:
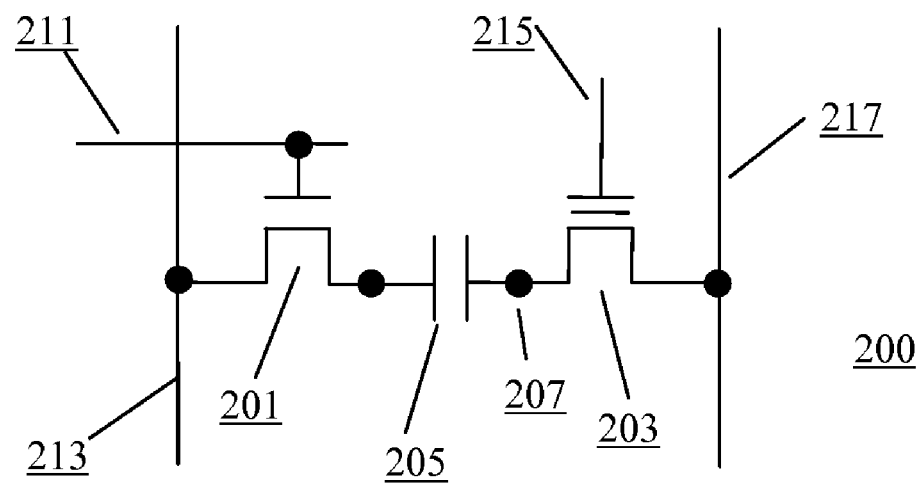
FIG. 2 illustrates a Random Access Memory cell with a floating-gate transistor storage element in series with storage capacitors in accordance with various embodiments.

FIG. 2 illustrates Random Access Memory cell 200 with floating-gate transistor 203 and storage capacitor 205 in series in accordance various embodiments. Storage capacitor 205 may be connected in series with floating-gate transistor 203. Also, access transistor 201 may be connected in series with storage capacitor 205. In embodiments, a first plate of storage capacitor 205 and a first node of floating-gate transistor 203 may both be connected to storage node 207. And, a second plate of storage capacitor 205 may be connected to a first node of access transistor 201. In embodiments, a second node of floating-gate transistor 203 may be connected to drain line 217 and a third node of floating-gate transistor 203 may be connected to control line 215. In embodiments, a second node of access transistor 201 may be connected to column line 213. Access transistor 201 may have a word line gate connected to row line 211. In embodiments, the floating-gate of floating-gate transistor 203 may be configured to hold a charge corresponding to a stored binary value. In embodiments, the stored binary value may be an n-bit binary value.

In embodiments, the column line 213 may be a voltage dependent element, such as a diffused junction capacitor $C_d$, the capacitance of which decreases as the reverse bias voltage across the junction increases. In embodiments, the capacitance of $C_d$ is inversely proportional to the square root of the reverse bias voltage across the junction plus approximately 0.6 V. Column line 213 may be pre-charged to a voltage level $V_p$. Since the second node of access transistor 201 may be connected to column line 213, the diffused junction capacitor $C_d$ and the storage capacitor 205 may be coupled in series, therefore the pre-charge voltage $V_p$ may be allocated between the two capacitors based at least on the ratio of their capacitance. So, the voltage range can be sensed at column line 213 may be decided by the voltage allocated to storage capacitor 205. In various embodiments, a higher pre-charge voltage $V_p$ (compared to supply voltage frequently used which is 3V, 1.8V or lower) may be employed, e.g. 5 V. Under such a high pre-charge voltage, the capacitance of the diffused junction capacitor $C_d$ may decrease and therefore more of the pre-charge voltage $V_p$ may be allocated to storage capacitor 205.

So, the voltage range that can be sensed at column line 213 may be even broader. This broader voltage sensing range may be particular useful for sensing the n-bit binary value stored at floating-gate transistor 203 with $2^n$ possible statuses. Also, each individual voltage at storage node 207 may be higher due to the relative higher pre-charge voltage $V_p$ employed and therefore it may be easier to sense such voltages with the consideration of noise and so forth.

In embodiments, during a read operation, an access circuitry (not shown) may be configured to set a select voltage on row line 211, a control voltage on control line 215, and a supply voltage on drain line 217. Embodiments are not limited to any particular supply or control voltages. During read, the access circuitry may be configured to interrogate or sense a resulting voltage on column line 213. In embodiments, the access circuitry may be configured to determine a binary value associated with the sensed voltage. If a negative charge has been previously stored on the floating-gate of floating-gate transistor 203, then the control voltage on control line 215—and therefore on the control gate—may be "masked" (neutralized or compensated) by the stored negative charge on the floating-gate. In that case, floating-gate transistor 203 may not be activated, no current may flow, and no voltage may be set at storage node 207. By contrast, if no negative charge has been previously stored on the floating-gate—or if such a stored negative charge has been subsequently erased — then there may be no masking of the control voltage, current may flow through floating-gate transistor 203, and a voltage may be set at storage node 207.

In embodiments, a stored negative charge on the floating-gate may indicate a binary "0" and the access circuitry may be configured to associate a low level of sensed voltage to a binary "0". In other words, the access circuitry may be configured to associate a sensed voltage falling within a relatively low range of voltages to a binary "0". The access circuitry may also be configured to associate a larger sensed voltage to a binary "1". In other words, the access circuitry may be configured to associate a sensed voltage falling within a relatively high range to a binary "1". In embodiments where the stored charge on the floating-gate transistor corresponds with an n-bit binary number, where n is greater than 1, the access circuitry may be configured to sense any of $2^n$ voltages and associate each with a different n-bit binary stored value. In such embodiments, the level of sensed voltages may be determined by a magnitude of the stored charge within the floating-gate transistor.

In embodiments, the floating-gate transistor may be configured to be written or programmed by either Fowler-Nordheim tunneling or hot electron injection, both of which are well-known in the art. Embodiments are not limited by any writing or programming techniques. The access circuitry (not shown) may be configured in embodiments to perform a write or program operation. In embodiments, the access circuitry may be configured to set column line 213 to 0V, row line 211 to a select voltage, and control line 215 and drain line 217 to a program voltage to write to the floating-gate. In embodiments, the program voltage may be greater than a supply voltage and the select voltage may be equal to, or nearly equal to, the supply voltage. In embodiments, the program voltage may be between 6V to 8V, or other voltage.

During an erase operation, the access circuitry (not shown) may be configured, in embodiments, to set column line 213 to ground, row line 211 to a select voltage, and drain line 217 to an erase voltage. In embodiments, the erase voltage may be greater than a supply voltage, and the select voltage may be equal to the supply voltage. This may result in a "drain-side"

erase. Alternatively, the access circuitry may be configured to perform a "source-side" erase.

The above embodiments may apply to n-channel floating-gate transistors; hence the positive voltages. The same concepts may apply equally to p-channel floating-gate transistors utilizing negative voltages. Also, in embodiments, a stored charge on the floating-gate of the floating-gate transistor may correspond to a binary "0", but may correspond to a binary "1" in other embodiments.

Figure 3:
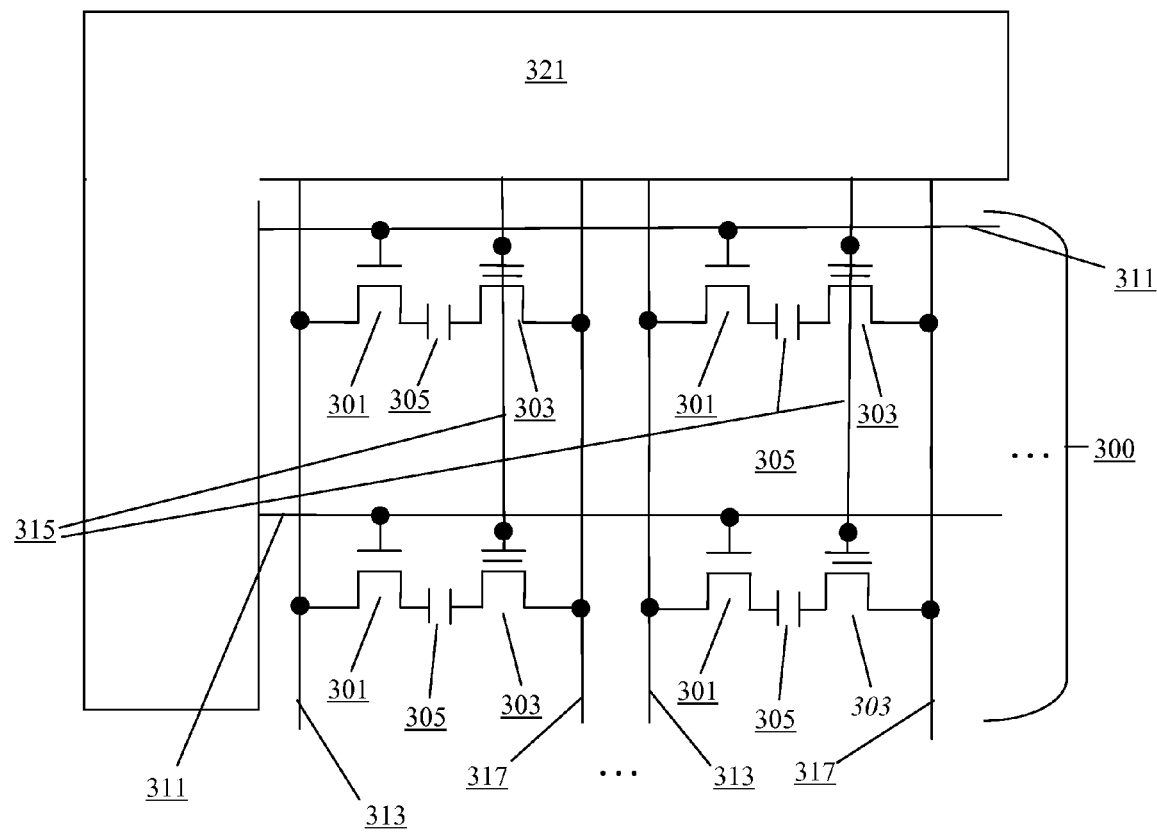
FIG. 3 illustrates Random Access Memory cell array with access circuitries, CMOS-Compatible Nonvolatile Storage Elements in series with storage capacitors in accordance with various embodiments.

FIG. 3 illustrates Random Access Memory cell array 300 with access circuitry 321 and CMOS-Compatible Nonvolatile Storage Elements 303 in series with storage capacitor 305 and access transistor 301 in accordance with various embodiments. Array 300 may include a plurality of row lines 311 and a plurality of column lines 313 arranged in a matrix configuration. Although array 300 is shown with only two column lines and two row lines—including four memory cells—many more row lines, column, lines, and memory cells in various configurations may be possible in various embodiments. Embodiments are not limited to any particular array size or sizes.

Access circuitry 321 may be coupled to the plurality of row lines 311, the plurality of column lines 313, a plurality of control lines 315, and a plurality of drain lines 317. In embodiments, access circuitry 321 may be configured to set one or more of the plurality of row lines to a select voltage to select a particular row or rows of memory cells to be read, written, or erased. In a read operation, in embodiments, access circuitry 321 may be configured to set one or more control lines 315 to a control voltage, and one or more drain lines 317 to a read voltage, and to sense a resulting voltage on column lines 313. In embodiments, access circuitry 321 may be configured to select a single word or memory cell for erase. In embodiments, the binary value corresponding to a stored charge may comprise n-bits and there may be $2^n$ possible resulting voltages during a read operation. In such embodiments, access circuitry 321 may be configured to determine the n-bit binary value based at least on the sensed voltages.

Figure 4:
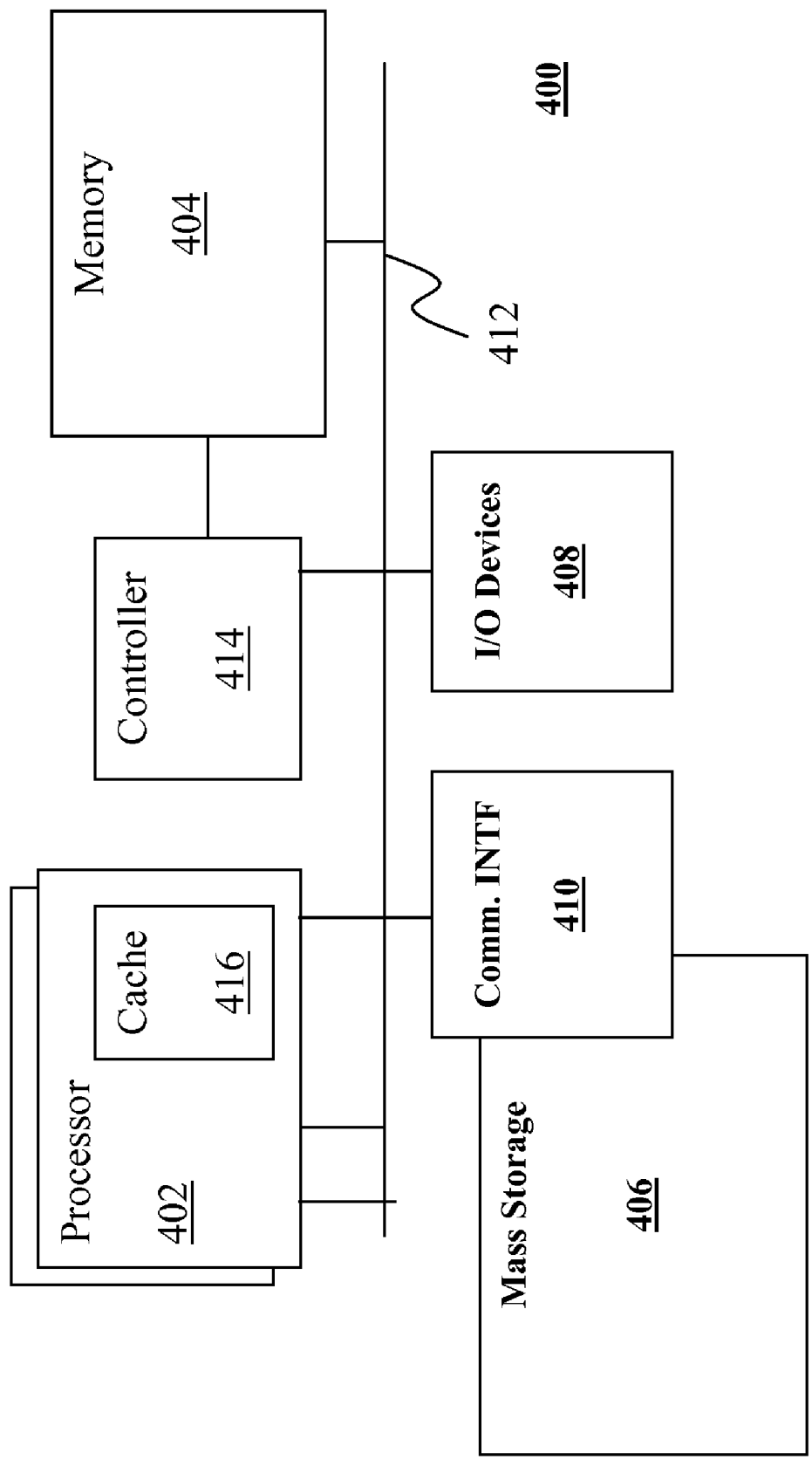
FIG. 4 illustrates a computing system including a memory device with memory cells having CMOS-Compatible Nonvolatile Storage Elements in series with storage capacitors in accordance with various embodiments.

FIG. 4 illustrates a computing system including a memory device with CMOS-Compatible Nonvolatile Storage Elements in accordance with various embodiments. As shown, computing system/device 400 may include one or more processors 402, and system memory 404. System memory 404 may be imbued with the teachings of one or more embodiments as described within this specification. In particular, system memory 404 may include one or more memory cells including CMOS-Compatible Nonvolatile Storage Elements, storage capacitors and access transistors connected in series. In embodiments, such CMOS-Compatible Nonvolatile Storage Elements may be a floating-gate transistor. In embodiments, it may be a Magnetoresistive Random Access Memory (MRAM) cell or a Phase-change memory (PCM) cell.

Additionally, computing system/device 400 may include mass storage devices 406 (such as diskette, hard drive, CDROM, flash memory, and so forth), input/output devices 408 (such as keyboard, cursor control and so forth) and communication interfaces 410 (such as network interface cards, modems and so forth). The elements may be coupled to each other via system bus 412, which represents one or more buses. In the case of multiple buses, they may be bridged by one or more bus bridges (not shown). Finally, controller 414 may be included and configured to operate memory 404 in accordance with embodiments.

In embodiments, one or more processors 402 may include memory cache 416. Other than the teachings of the various embodiments of the present invention, each of the elements of computer system/device 400 may perform its conventional functions known in the art. In particular, system memory 404 and mass storage 406 may be employed to store a working copy and a permanent copy of programming instructions implementing one or more software applications.

Although FIG. 4 depicts a computer system, one of ordinary skill in the art will recognize that embodiments of the disclosure may be practiced using other devices that utilize RAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art.

In various embodiments, the earlier-described memory cells are embodied in an integrated-circuit. Such an integrated-circuit may be described using any one of a number of hardware-design-languages, such as but not limited to VHSIC hardware-description-language (VHDL) or Verilog. The compiled design may be stored in any one of a number of data format, such as but not limited to GDS or GDS II. The source and/or compiled design may be stored on any one of a number of medium such as but not limited to DVD.

Figure 5:
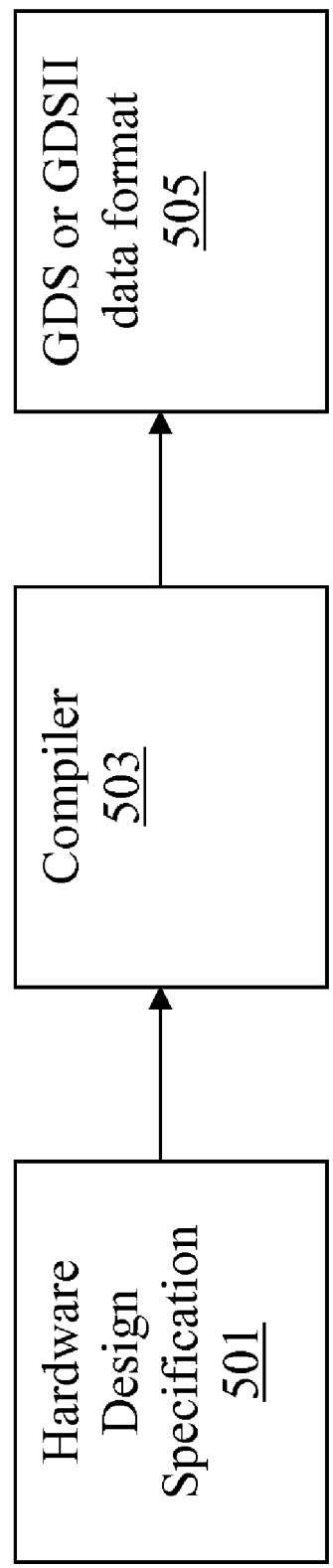
FIG. 5 shows a block diagram of a hardware design specification being compiled into GDS or GDSII data format in accordance with various embodiments.

FIG. 5 shows a block diagram depicting the compilation of a hardware design specification 501 which may be run through compiler 503 producing GDS or DGSII data format 505 describing an integrated circuit in accordance with various embodiments.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the disclosure may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A memory device, comprising:
    a plurality of row lines and a plurality of column lines; and
    a memory cell coupled to one of the plurality of column lines and to one of the plurality of row lines, the memory cell including:
        a capacitor with a first plate coupled to a storage node of the memory cell; and
        a CMOS-compatible non-volatile storage element comprising a first node coupled to the storage node, wherein the CMOS-compatible non-volatile storage element is configured to hold a charge corresponding to a binary value, and
    wherein the CMOS-compatible non-volatile storage element is coupled to a control line; and
    access circuitry coupled to the plurality of row lines, the plurality of column lines, and the control line, wherein the access circuitry is configured to toggle the control line to a control voltage during a read operation, and wherein the CMOS-compatible non-volatile storage element is configured to set, in response to the control voltage, a voltage on the storage node that is dependent on a value of the charge.

2. The memory device of claim 1, wherein the memory cell further comprises an access transistor including a word line gate, a first node, and a second node, wherein the word line gate is coupled to the one of the plurality of row lines, the first node is coupled to a second plate of the capacitor, and wherein the second node is coupled to the one of the plurality of column lines.

3. The memory device of claim 2, further comprising a voltage-dependent element arranged in series with the second node of the access transistor, wherein the plurality of column lines are configured to be pre-charged to a voltage level, with the pre-charge voltage allocated to the voltage-dependent element and to the capacitor in the memory cell, and wherein the allocation is based, at least in part, on the relative capacitances of the voltage-dependent element and the capacitor.

4. The memory device of claim 3, wherein the voltage-dependent element is the one of the plurality of column lines.

5. The memory device of claim 4, wherein the capacitance of the voltage-dependent element is inversely proportional to the pre-charge voltage allocated to the voltage-dependent element.

6. The memory device of claim 4, wherein at least one of the plurality of column lines is a diffused junction capacitor.

7. The memory device of claim 1, wherein the CMOS-compatible non-volatile storage element is a floating-gate transistor including a control gate coupled to the control line.

8. The memory device of claim 7, wherein a floating gate of the floating-gate transistor is configured to hold the charge, wherein the floating gate is further configured to cause, in response to the control voltage during the read operation, current to flow to the storage node, and wherein a level of the current is dependent on the charge.

9. The memory device of claim 1, wherein the CMOS-compatible non-volatile storage element is one of a Magnetoresistive Random Access Memory (MRAM) cell or a Phase-Change Memory (PCM) cell.

10. The memory device of claim 1, wherein the binary value comprises n bits and the resulting voltage is one of $2^n$ possible voltages, where n is an integer.

11. A method of operating digital memory, the method comprising:
toggling, by access circuitry of a digital memory device during a read operation:
a control gate of a floating-gate transistor to a control voltage of a memory cell in the digital memory device, wherein the floating-gate transistor is configured to hold a charge corresponding to a binary value and to set, in response to the control voltage, a storage node of the memory cell to a voltage that is dependent on a value of the charge held on the floating-gate transistor, wherein the floating-gate transistor is coupled in series to a storage capacitor, wherein a first node of the floating-gate transistor is coupled to a first plate of the storage capacitor and wherein a second node of the floating gate transistor is coupled to a drain line;
a row line coupled to a word line gate of an access transistor of the memory cell to a select voltage, wherein the access transistor includes a first node coupled to a second plate of the storage capacitor and a second node coupled to a column line; and
the drain line to a supply voltage; and
sensing, by the access circuitry, a voltage resulting from said toggling, and
determining, based on the sensed voltage, the binary value.

12. The method of claim 11, wherein the binary value comprises n bits, where n is an integer.

13. An apparatus, comprising:
means for toggling, during a read operation:
a control line of a memory cell in a digital memory device to a control voltage;
a row line coupled to the memory cell to a select voltage; and
a drain line coupled to the memory cell to a supply voltage; and
means for sensing a voltage on a column line resulting from the toggling of the control, row, and drain lines;
wherein the memory cell further comprises a CMOS-compatible non-volatile storage element configured to toggle, in response to the control voltage, the voltage on a storage node of the memory cell, and wherein the voltage is dependent on a value of a held charge.

14. The apparatus of claim 13, wherein the voltage corresponds to a binary value comprising n bits, where n is an integer.

15. A system, comprising:
a digital memory controller configured to issue access commands to a digital memory device; and
the digital memory device, coupled to the controller, and including:
a plurality of row lines and a plurality of column lines;
a memory cell coupled to one of the plurality of column lines, to one of the plurality of row lines, and to a control line, wherein the memory cell comprises:
a capacitor with a first plate coupled to a storage node; and
a CMOS-compatible non-volatile storage element including a first node coupled to the storage node and configured to hold a charge corresponding to a binary value; and
access circuitry coupled to the plurality of row lines, the plurality of column lines, and the control line, wherein the access circuitry is configured to toggle the control line to a control voltage during a read operation, and wherein the CMOS-compatible non-volatile storage element is configured to toggle, in response to the control voltage, the storage node to a voltage that is dependent on a value of the charge.

16. The system of claim 15, wherein the memory cell further comprises an access transistor including a word line gate, a first node, and a second node, wherein the word line gate is coupled to the one of the plurality of row lines, wherein the first node is coupled to a second plate of the capacitor, and wherein the second node is coupled to the one of the plurality of column lines.

17. The system of claim 16, further comprising a voltage-dependent element arranged in series with the second node of the access transistor, wherein the access circuitry is further configured to precharge the plurality of column lines to a precharge voltage level, with a pre-charge voltage allocated to the voltage-dependent element and to the capacitor, and wherein the allocation is based, at least in part, on the relative capacitances of the voltage-dependent element and the capacitor.

18. The system of claim 17, wherein the voltage-dependent element is the one of the plurality of column lines.

19. The system of claim 18, wherein the capacitance of the voltage-dependent element is inversely proportional to the voltage allocated to the voltage-dependent element.

20. The system of claim 18, wherein at least one of the plurality of column lines is a diffused junction capacitor.

21. The system of claim 15, wherein the CMOS-compatible non-volatile storage element is a floating-gate transistor.

22. The system of claim 21, wherein a floating gate of the floating-gate transistor is configured to hold the charge, wherein the floating gate is further configured to cause, in response to the control voltage during the read operation, current to flow to the storage node, and wherein a level of the current is dependent on the charge.

23. The system of claim 15, wherein the CMOS-compatible non-volatile storage element is one of a Magnetoresistive Random Access Memory (MRAM) cell or a Phase-Change Memory (PCM) cell.

24. The system of claim 15, wherein the binary value comprises n bits, where n is an integer.

25. An article of manufacture, comprising a non-transitory computer-readable medium including a plurality of computer-readable hardware design language instructions, or compilation of the hardware design language instructions, wherein the hardware design language instructions specify an implementation of the memory device as set forth in claim 1 as an integrated circuit.

26. The article of manufacture of claim 25, wherein a hardware design language of the hardware design language instructions comprises either VHDL or Verilog.

* * * * *

UNITED STATES PATENT AND TRADEMARK OFFICE
CERTIFICATE OF CORRECTION

PATENT NO. : 8,050,080 B2
APPLICATION NO. : 12/043044
DATED : November 1, 2011
INVENTOR(S) : Rao Page 1 of 1

It is certified that error appears in the above-identified patent and that said Letters Patent is hereby corrected as shown below:

Page 2, item (56), under "Other Publications", in Column 1, Lines 12-13, delete "Dec. 11, 2009." and insert -- Nov. 12, 2009. --.

Page 2, item (56), under "Other Publications", in Column 2, Line 24, delete "Supplmental Ntc of Allowability," and insert -- Supplemental Notice of Allowability, --.

Column 7, line 22, in Claim 6, delete "diffused junction" and insert -- diffused-junction --.

Column 8, lines 50-51, in Claim 17, delete "voltage- dependent" and insert -- voltage-dependent --.

Column 8, lines 53-54, in Claim 17, delete "configured to precharge the plurality of column lines to a precharge voltage level," and insert -- configured to pre-charge the plurality of column lines to a pre-charge voltage level, --.

Column 8, line 65, in Claim 20, delete "diffused junction" and insert -- diffused-junction --.

Signed and Sealed this
Twelfth Day of June, 2012

David J. Kappos
*Director of the United States Patent and Trademark Office*